United States Patent
Ko et al.

(10) Patent No.: US 9,726,990 B2
(45) Date of Patent: Aug. 8, 2017

(54) LITHOGRAPHY MASK REPAIR METHODS

(71) Applicant: Taiwan Semiconductor Manufacturing Company, Ltd., Hsin-Chu (TW)

(72) Inventors: Wu Hung Ko, Tainan (TW); Kun-Lung Hsieh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 654 days.

(21) Appl. No.: 13/782,019

(22) Filed: Mar. 1, 2013

(65) Prior Publication Data

US 2014/0246045 A1 Sep. 4, 2014

(51) Int. Cl.
| | |
|---|---|
| *B08B 6/00* | (2006.01) |
| *B08B 3/00* | (2006.01) |
| *G03F 7/20* | (2006.01) |
| *G03F 1/72* | (2012.01) |
| *G03F 1/82* | (2012.01) |

(52) U.S. Cl.
CPC ............ *G03F 7/70925* (2013.01); *G03F 1/72* (2013.01); *G03F 1/82* (2013.01)

(58) Field of Classification Search
None
See application file for complete search history.

(56) References Cited

U.S. PATENT DOCUMENTS

| | | | | | |
|---|---|---|---|---|---|
| 3,998,654 | A | * | 12/1976 | Falaas | C09D 9/00 134/38 |
| 5,616,927 | A | * | 4/1997 | Kubota | G03F 1/64 250/492.2 |
| 5,629,115 | A | * | 5/1997 | Kawano | G03F 1/32 430/322 |
| 6,734,443 | B2 | * | 5/2004 | Zheng | G03F 7/70983 134/1.1 |
| 6,765,645 | B1 | * | 7/2004 | Lee | G03F 7/70983 355/30 |
| 8,657,966 | B2 | * | 2/2014 | Kalyankar | B08B 3/10 134/26 |
| 2008/0057411 | A1 | * | 3/2008 | Carpenter | G03F 1/32 430/5 |
| 2009/0004574 | A1 | * | 1/2009 | Lee | G03F 1/26 430/5 |
| 2009/0258159 | A1 | * | 10/2009 | Su | G03F 1/82 427/534 |

* cited by examiner

*Primary Examiner* — Eric Golightly
*Assistant Examiner* — Arlyn I Rivera-Cordero
(74) *Attorney, Agent, or Firm* — Slater Matsil, LLP

(57) ABSTRACT

Lithography mask repair methods are disclosed. In one embodiment, a method of repairing a lithography mask includes providing a lithography mask, exposing a back side of the lithography mask to vacuum ultraviolet (VUV) energy, and cleaning the lithography mask.

20 Claims, 6 Drawing Sheets

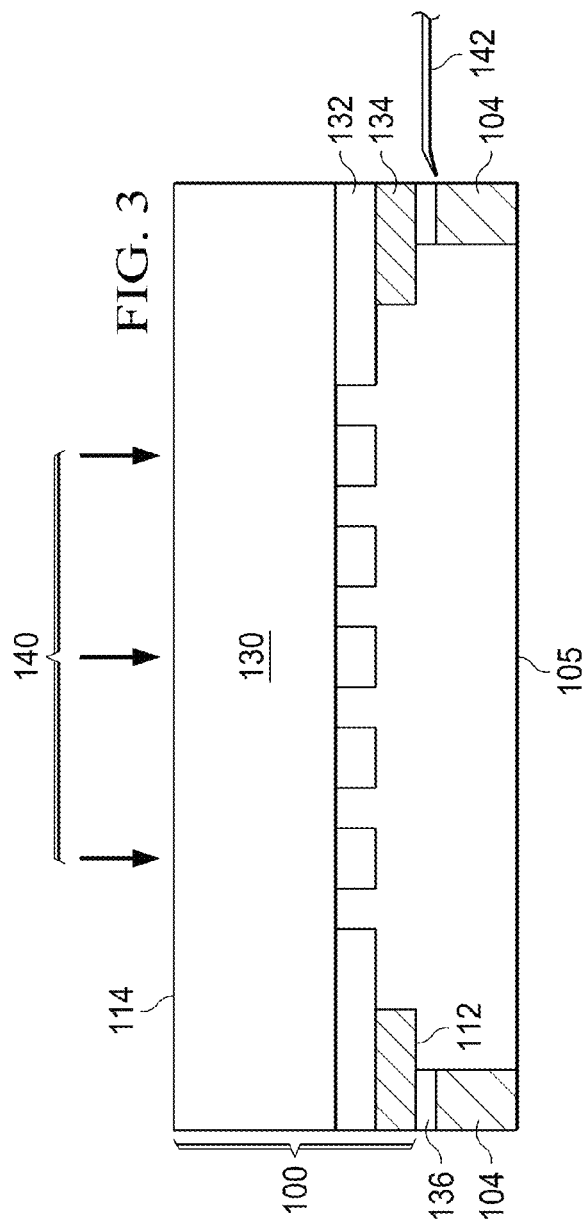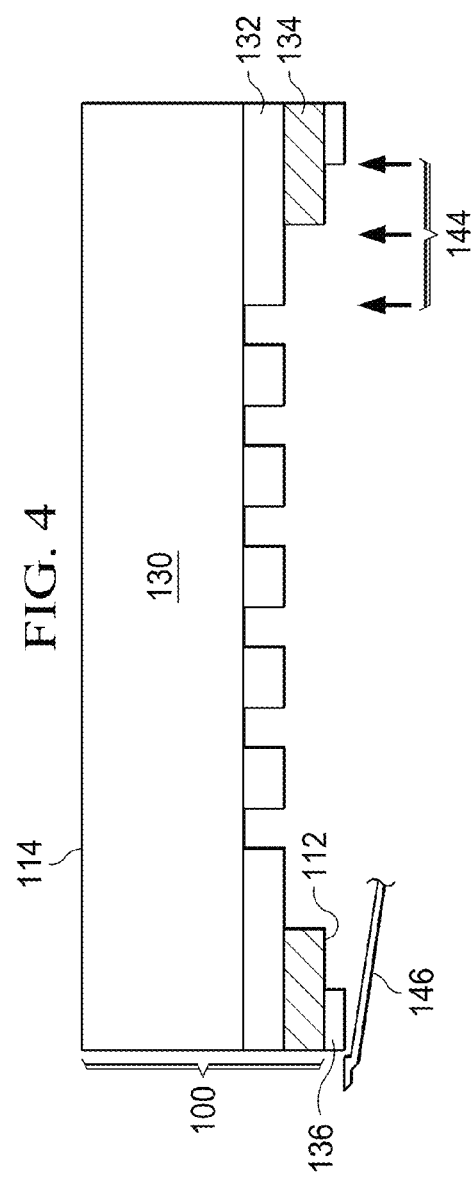

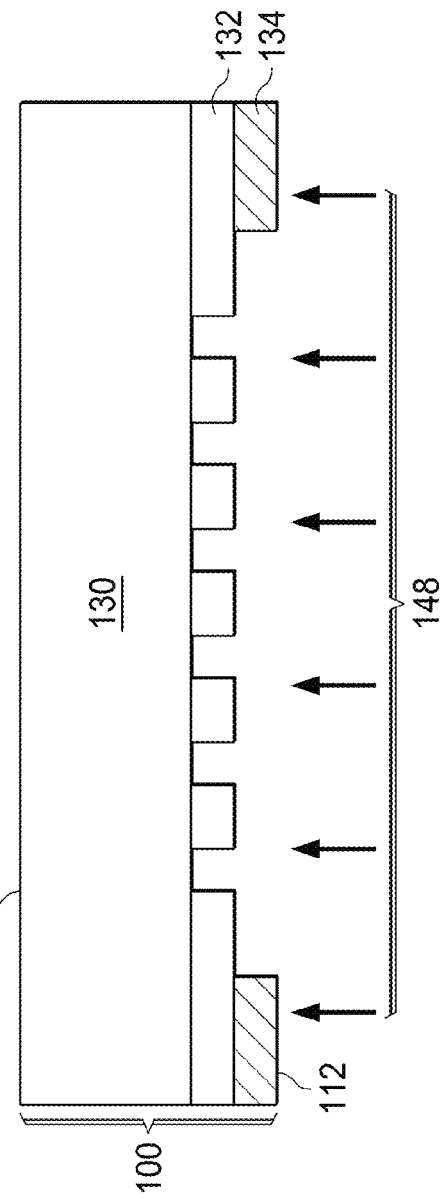
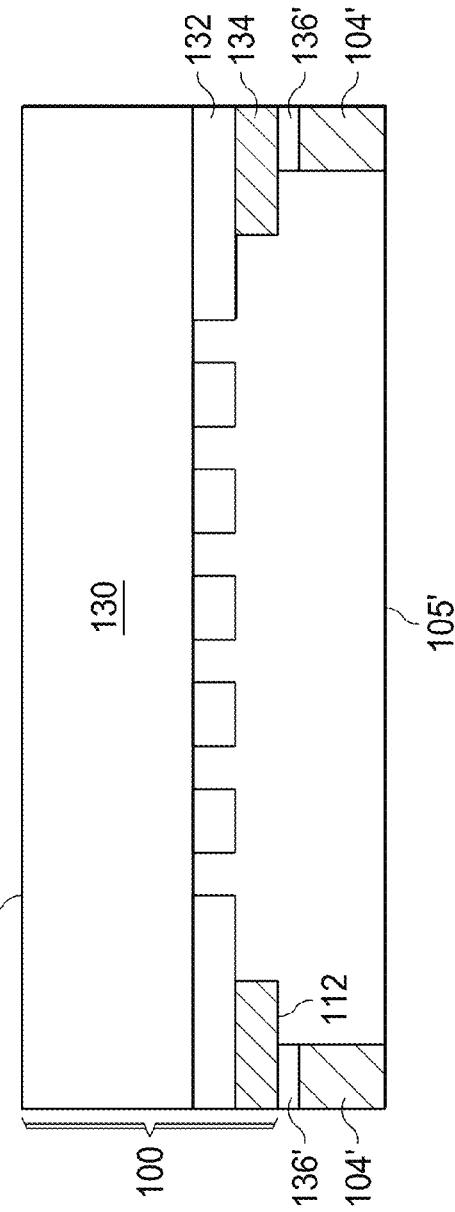

LITHOGRAPHY MASK REPAIR METHODS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

In a lithography process, a layer of photosensitive material such as a photoresist is deposited over a material layer of a semiconductor device. The photosensitive material is patterned by exposure to light or energy passed through or reflected from a lithography mask having a desired pattern thereon. The photosensitive material is developed, and exposed (or unexposed, depending on whether the photosensitive material is positive or negative) portions of the photosensitive material are removed using an ash and/or etch process. The photosensitive material is then used as an etch mask during an etch process to pattern the material layer of the semiconductor device, and the photosensitive material is then removed.

A lithography mask is used hundreds or thousands of times to pattern semiconductor devices. Over time, lithography masks tend to become contaminated with debris, such as haze, that forms on the surfaces of the lithography masks. Thus, repair methods are occasionally required for used lithography masks, in order to remove the debris.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2 through 5 illustrate cross-sectional views of a method of repairing a lithography mask at various stages in accordance with some embodiments of the present disclosure;

FIG. 6 is a cross-sectional view of a lithography mask after the repair method shown in FIGS. 2 through 5;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to lithography masks used in semiconductor device processing. Novel repair methods for lithography masks will be described herein.

Figure 1:
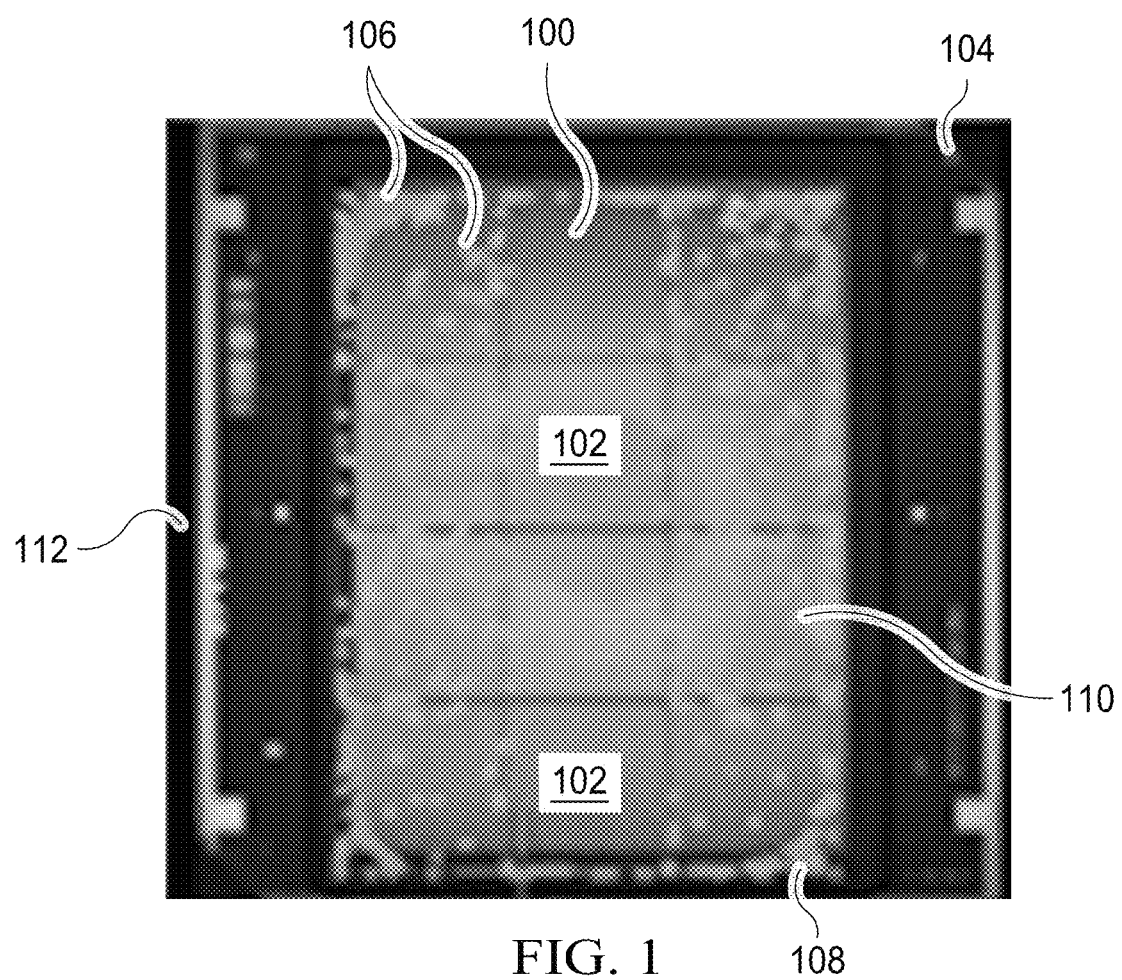
FIG. 1 shows a top view of a used lithography mask that has haze disposed thereon.

FIG. 1 shows a top view of a used lithography mask 100. The lithography mask 100 comprises a plurality of regions 102. Each region 102 contains a pattern for a material layer of a semiconductor device, such as an integrated circuit. The regions 102 may contain the same pattern in some embodiments, so that the lithography mask 100 can be used to form the same pattern across a surface of a workpiece such as a semiconductor wafer, for example. Alternatively, the regions 102 may contain different patterns, depending on the application that the lithography mask 100 is used for.

The lithography mask 100 is coupled to a pellicle 104 that is adapted to protect the lithography mask 100. The pellicle 104 is coupled to the front side 112 of the lithography mask. Over time and after many times of use, haze 108 tends to develop, particularly in corners of the lithography mask 100. The haze 108 causes problems in the pattern transfer to a semiconductor device, similar to a dirty or damaged lens of a camera causing imperfections in a photograph when capturing an image, for example.

Figure 2:
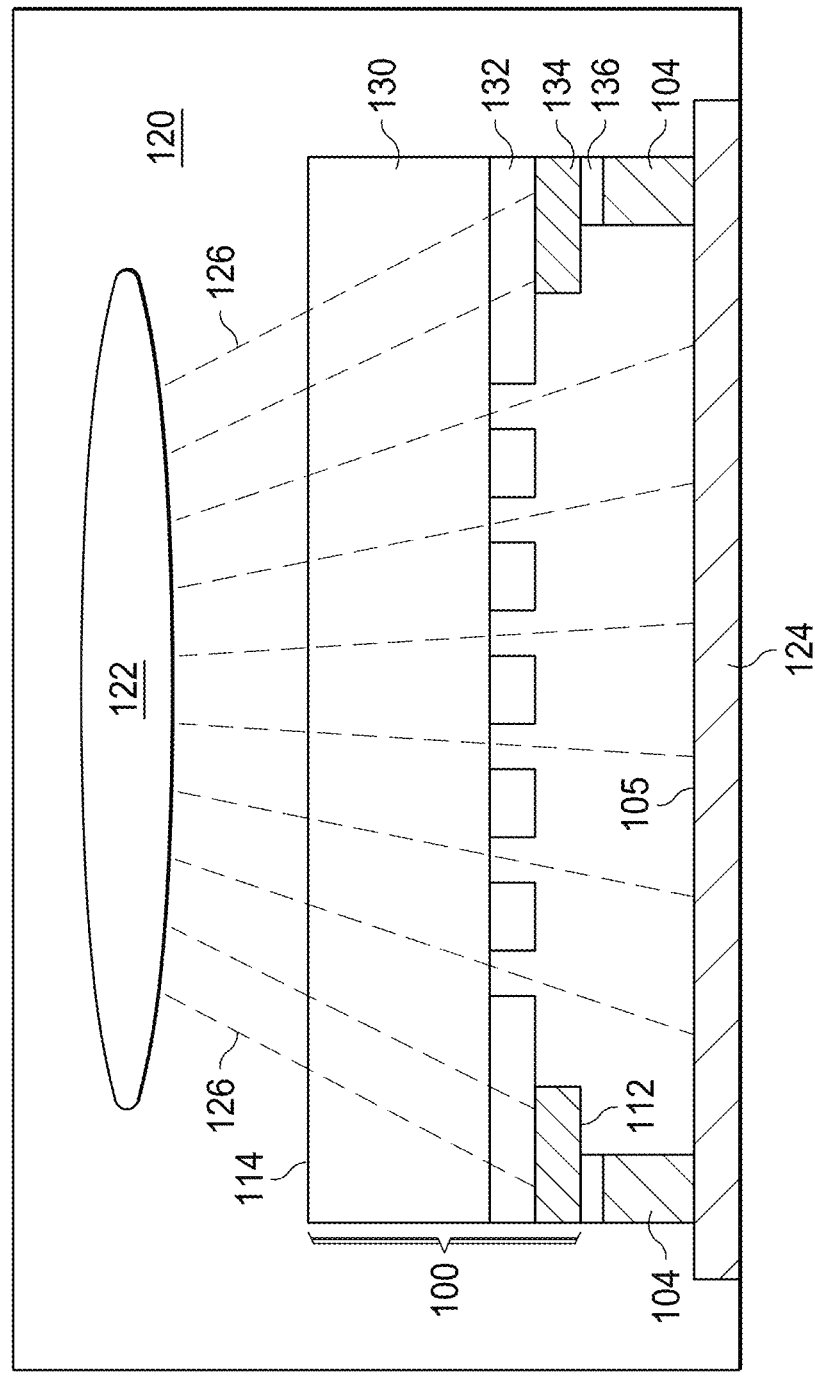

The lithography mask 100 is exposed to vacuum ultraviolet (VUV) energy 126, as shown in FIG. 2. The VUV energy 126 alters the surface wettability of the lithography mask 100 so that a subsequent cleaning process is more effective.

FIGS. 2 through 5 illustrate cross-sectional views of a method of repairing a lithography mask 100 at various stages in accordance with some embodiments of the present disclosure. First, a lithography mask 100 is provided. The lithography mask 100 has a front side 112 and a back side 114 opposite the front side 112. The front side of the lithography mask 100 is attached to the pellicle 104 by an adhesive 136. The adhesive 136 comprises glue in some embodiments, although alternatively, the adhesive 136 may comprise other materials. The pellicle 104 may include a cover 105 that includes a transparent membrane disposed over the front side 112 of the lithography mask 100 in some embodiments.

The lithography mask 100 may comprise a binary mask, a phase shifting mask (PSM), an attenuated mask, and/or combinations thereof, as examples. Alternatively, the lithography mask 100 may comprise other types of masks used in photolithography processes for semiconductor devices. The lithography mask 100 shown in FIG. 2 comprises an attenuated phase-shifting mask comprising a substrate 130, a first patterned layer 132 disposed on the substrate 130, and a second patterned layer 134 disposed on the first patterned layer 132. The substrate 130 comprises a transparent material such as glass or quartz in some embodiments. The first patterned layer 132 comprises a translucent material in some embodiments. In other embodiments, the first patterned layer 132 comprises MoSi. The second patterned layer 134 comprises an opaque material in some embodiments. In some embodiments, the second patterned layer 134 comprises Cr. Alternatively, the first patterned layer 132 or the second patterned layer 134 may not be included in some embodiments, and the substrate 130, the first patterned layer 132, and the second patterned layer 134 may comprise other materials.

To expose the lithography mask 100 to VUV energy 126, the lithography mask 100 is placed in a chamber 120. The chamber 120 includes a VUV energy source 122. The lithography mask 100 is placed on a support 124 within the chamber 120. The lithography mask 100 is placed with the front side 112 (e.g., the pellicle 104 side) of the lithography mask 100 towards the support 124 so that the back side 114 of the lithography mask 100 is exposed to the VUV energy 126. The back side 114 of the lithography mask 100 comprises a side of the lithography mask 100 comprising the substrate 130 in some embodiments, for example.

The VUV energy 126 comprises a wavelength of about 172 nm in some embodiments, as an example. The VUV energy 126 comprises ultraviolet (UV) light having a wavelength of about 160 nm to about 180 nm, in other embodiments. The vacuum level or pressure level in the chamber 120 during the VUV energy 126 exposure comprises about 0.1 atmosphere (atm) to about 1 atm, in some embodiments. The back side 114 of the lithography mask 100 is exposed to the VUV energy 126 for a time period of about 3 minutes to about 10 minutes in some embodiments, for example. Alternatively, the VUV energy 126 exposure may comprise other wavelengths, pressures, and time periods, in other embodiments. The VUV energy 126 comprises short wavelength UV radiation emitted by plasma in some embodiments, as another example.

Exposing the back side 114 of the lithography mask 100 to the VUV energy 126 increases the wettability of a surface of the lithography mask 100 in some embodiments. The wettability of the front side 112 and/or back side 114 of the lithography mask 100 is increased in some embodiments, for example.

After exposing the lithography mask 100 to the VUV energy 126, the lithography mask 100 is removed from the chamber 120. In some embodiments, a surface of the lithography mask 100 is hydrophobic before exposing the lithography mask 100 to the VUV energy 126. The hydrophobic surface of the lithography mask 100 can cause many edge and corner defects 106 (see FIG. 1) after a cleaning process 148 (see FIG. 5), for example. The removal of the defects 106 caused by use of the lithography mask 100 can require many chemical cleaning resources and repetitive cleaning steps. Advantageously, exposing the lithography mask 100 to the VUV energy 126 causes the surface of the lithography mask 100 to become hydrophilic in some embodiments. Converting the hydrophobic surface of the lithography mask 100 to a hydrophilic surface causes no edge and corner defects 106, in some embodiments. Exposing the lithography mask 100 to the VUV energy 126 may also remove haze 108 more easily and more completely. The VUV energy 126 quickly and uniformly changes the front side 112 surface of the lithography mask 100 into a hydrophilic surface in some embodiments, ensuring the removal of substantially all of the haze 108 from the lithography mask 100 in the later cleaning process 148, for example.

After exposing the lithography mask 100 to the VUV energy 126, the pellicle 104 is removed from the lithography mask 100, as shown in FIGS. 3 and 4. The pellicle 104 is removed by increasing the temperature of the lithography mask 100 using a heating process 140, and removing the pellicle 104 using an assist tool 142 in some embodiments. The heating process 140 may comprise a temperature of about 90 degrees C. to about 150 degrees C., for example. The lithography mask 100 may be heated for about 1 minute to about 5 minutes, as an example. Alternatively, the heating process 140 may comprise other temperatures and time durations. The pellicle 104 may be removed during or after the heating process 140, for example. The assist tool 142 assists in prying or pulling the pellicle 104 apart from the lithography mask 100 in some embodiments. Alternatively, the pellicle 104 can be removed from the lithography mask 100 using other methods.

The adhesive 136 is then removed from the lithography mask 100, as shown in FIG. 4. In some embodiments, the adhesive 136 is removed from the lithography mask 100 by manually removing the adhesive 136 using lemon acid 144 and a wiper 146. Alternatively, the adhesive 136 can be removed using other methods, devices, and substances.

After the VUV energy 126 exposure, the removal of the pellicle 104, and the removal of the adhesive 136 from the lithography mask 100, the lithography mask 100 is then cleaned using a cleaning process 148, as shown in FIG. 5. In some embodiments, the front side 112 of the lithography mask 100 is cleaned using the cleaning process 148. In other embodiments, the back side 114 of the lithography mask 100 is cleaned. In some embodiments, both the front side 112 and the back side 114 of the lithography mask 100 are cleaned, as another example. In some embodiments, the cleaning process 148 comprises using a substance such as $O_3$, standard clean 1 (SC1), deionized hydrogen ($DIH_2$), deionized water (DIW), and/or combinations thereof, for example. Alternatively, the cleaning process 148 may comprise other substances or processes, in other embodiments.

FIG. 6 is a cross-sectional view of a lithography mask 100 after the repair method shown in FIGS. 2 through 5. After the lithography mask 100 is repaired using the novel methods described herein, the lithography mask 100 is prepared for re-use. As an example, another pellicle 104' including a protective front cover 105' can be attached to the lithography mask 100 by an adhesive 136', as illustrated in FIG. 6. The lithography mask 100 and pellicle 104' are then inspected. The lithography mask 100 is then used to pattern material layers of additional semiconductor devices. After a predetermined number of uses of the repaired lithography mask 100, or after haze 108 is detected on the lithography mask 100, the repair processes described herein can then be repeated.

Figure 7:
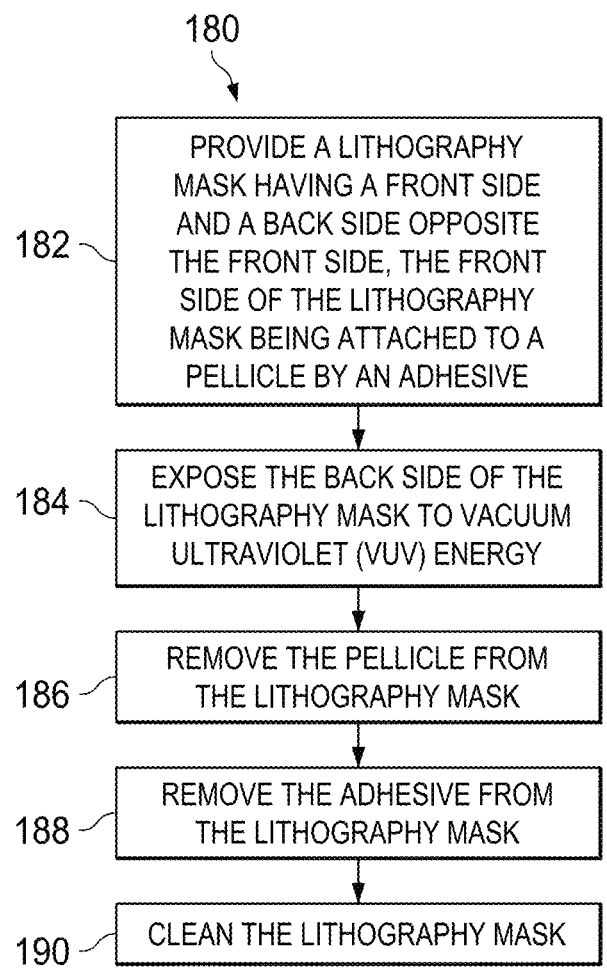
FIG. 7 is a flow chart illustrating a method of repairing a lithography mask in accordance with some embodiments.

FIG. 7 is a flow chart 180 illustrating a method of repairing a lithography mask 100 in accordance with some embodiments. In step 182, a lithography mask 100 is provided that has a front side 112 and a back side 114 opposite the front side 112. The front side 112 of the lithography mask 100 is attached to a pellicle 104 by an adhesive 136 (refer also to FIG. 2). In step 184, the back side 114 of the lithography mask 100 is exposed to VUV energy 126. In step 186, the pellicle 104 is removed from the lithography mask 100. In step 188, the adhesive 136 is removed from the lithography mask 100. In step 190, the lithography mask 100 is cleaned.

Figure 8:
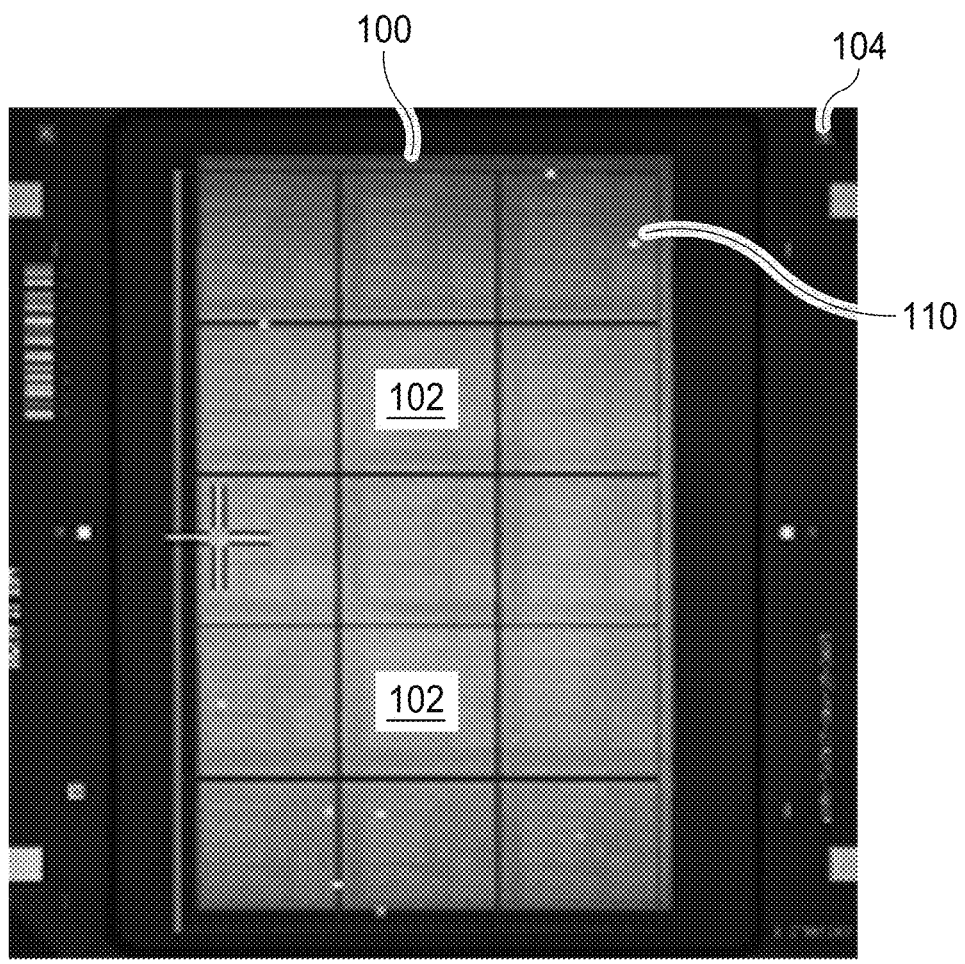
FIG. 8 is a top view of a lithography mask after the novel repair processes described herein in accordance with some embodiments.

FIG. 8 is a top view illustrating a lithography mask 100 after the novel repair processes described herein. Substantially all of the haze 108 is removed from the lithography mask 100 using the repair processes in accordance with some embodiments, for example. In some embodiments, about 95% or greater of the haze 108 is removed from the lithography mask 100 using the repair processes of the present disclosure. In other embodiments, greater than about 99% of the haze 108 is removed from the lithography mask 100. In some embodiments, substantially all of the haze 108 (not shown in FIG. 8; see FIG. 1) is removed after the cleaning process 148, as another example.

Advantages of some embodiments of the disclosure include providing novel repair processes for lithography masks 100. Massive defects of lithography masks 100 are removed, prevented, and avoided using the repair processes described herein. Applying a back side 114 VUV energy 126 as a pre-treatment method before the cleaning process 148 advantageously prevents massive edge and corner defects 106. Haze 108 is removed and/or reduced on used lithography masks 100 by applying the VUV energy 126 before the cleaning process 148. Converting the hydrophobic surface of the lithography mask 100 to a hydrophilic surface using the VUV energy 126 reduces further growth of haze 108 in corners of the lithography mask 100 in some embodiments.

Massive edge and corner defect prevention does not require harsh chemicals or a large number of repetitive cleaning steps, which avoids damage to the lithography mask 100. Because the pellicle 104 and adhesive 136 are removed after the VUV energy 126 exposure yet before the cleaning process 148, removal of the haze 108 is facilitated. The cleaning process 148 is facilitated by the VUV energy 126 exposure, so that corner and edge defects 106 are prevented, which advantageously prevents critical dimension (CD) loss for the lithography mask 100, and furthermore, maintains the pattern integrity of the lithography mask 100.

The VUV energy 126 is applied to the back side 114 of the lithography mask 100 so that the adhesive 136 is not exposed to the VUV energy 126. The Cr of the second patterned layer 134 of the lithography mask 100 blocks the VUV energy 126 from reaching the adhesive 136, which could cause a risk of the adhesive 136 becoming irremovable from the lithography mask 100, for example. The Cr of the lithography mask 100 is opaque for VUV energy 126 and protects the adhesive 136 from changing during the VUV energy 126 exposure, for example. Furthermore, applying the VUV energy 126 to the back side 114 of the lithography mask 100 avoids exposing the cover 105 of the pellicle 104 to the VUV energy 126, which could damage the membrane of the cover 105.

Cycle times for cleaning, and repair tool and inspection tool resources for the lithography masks 100 are reduced by embodiments of the present disclosure, which also results in reduced costs. The improved repair process results in a decreased amount of scrap lithography masks 100 and increases the lithography mask 100 lifetime. A lower frequency of cleaning the lithography masks 100 is achieved, minimizing deleterious effects on critical dimension and optics characteristics changes, such as phase angle drop and transmission variation of the lithography masks 100. Cleaning yields of the lithography masks 100 are also improved. In addition, the novel repair methods described herein are easily implementable in lithography process flows.

In accordance with some embodiments of the present disclosure, a method of repairing a lithography mask includes providing a lithography mask including a front side and a back side opposite the front side, exposing the back side of the lithography mask to VUV energy, and cleaning the lithography mask.

In accordance with other embodiments, a method of repairing a lithography mask includes providing a lithography mask, the lithography mask being coupled to a pellicle, and exposing the lithography mask to VUV energy. The pellicle is removed from the lithography mask, and the lithography mask is cleaned.

In accordance with other embodiments, a method of repairing a lithography mask includes providing a lithography mask having a front side and a back side opposite the front side. The front side of the lithography mask is attached to a pellicle by an adhesive. The method includes exposing the back side of the lithography mask to VUV energy, and removing the pellicle from the lithography mask. The adhesive is removed from the lithography mask, and the lithography mask is cleaned.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of repairing a lithography mask, the method comprising:
   providing the lithography mask, the lithography mask being coupled to a pellicle, the lithography mask comprising:
      a substrate;
      a first patterned layer over the substrate, the first patterned layer comprising MoSi; and
      a second patterned layer over the first patterned layer, the second patterned layer comprising Cr, the second patterned layer forming a first continuous loop, an adhesive directly over the second patterned layer, the adhesive forming a second continuous loop concentric with the first continuous loop, a frame of the pellicle being directly over the adhesive and at least a portion of the second patterned layer;
   exposing the lithography mask to a vacuum ultraviolet (VUV) energy such that at least a portion of the pellicle remains unexposed, the unexposed portion of the pellicle being blocked from the VUV energy by the second patterned layer;
   removing the pellicle from the lithography mask; and
   cleaning the lithography mask.

2. The method according to claim 1, wherein the lithography mask comprises a type of mask selected from the group consisting essentially of a binary mask, a phase shifting mask (PSM), an attenuated mask, and combinations thereof.

3. The method according to claim 1, wherein the lithography mask comprises a front side and a back side opposite the front side, and wherein the pellicle is coupled to the front side of the lithography mask.

4. The method according to claim 3, wherein exposing the lithography mask to the VUV energy comprises exposing the back side of the lithography mask to the VUV energy.

5. A method of repairing a lithography mask, the method comprising:
   providing the lithography mask, the lithography mask having a front side and a back side opposite the front side, the front side of the lithography mask being attached to a pellicle by an adhesive, the lithography mask comprising:

a substrate;

a first patterned layer over the substrate, the first patterned layer comprising a translucent material, the first patterned layer having an inner portion and an outer portion, the inner portion having a fully exposed front side surface, the outer portion formed in the shape of a ring; and a second patterned layer over the first patterned layer, the second patterned layer comprising an opaque material, a portion of the second patterned layer physically contacting the adhesive and the outer portion of the first patterned layer, the adhesive being directly over the outer portion of the first patterned layer;

exposing the back side of the lithography mask to a vacuum ultraviolet (VUV) energy such that the adhesive remains unexposed, the adhesive being blocked from the VUV energy by the second patterned layer;

removing the pellicle from the lithography mask, comprising:

heating the lithography mask; and using an assist tool to pull the pellicle apart from the lithography mask;

removing the adhesive from the lithography mask, comprising manually removing the adhesive; and cleaning the lithography mask.

6. The method according to claim 5, wherein removing the adhesive from the lithography mask comprises manually removing the adhesive using lemon acid and a wiper.

7. The method according to claim 5, wherein cleaning the lithography mask comprises cleaning the lithography mask with a substance consisting essentially of $O_3$, standard clean 1 (SC1), deionized hydrogen ($DIH_2$), deionized water (DIW), and combinations thereof.

8. The method according to claim 5, wherein exposing the back side of the lithography mask to the VUV energy comprises placing the lithography mask in a chamber, exposing the lithography mask to the VUV energy, and removing the lithography mask from the chamber.

9. The method according to claim 5, wherein exposing the back side of the lithography mask to the VUV energy increases a wettability of a surface of the lithography mask.

10. The method of claim 5, wherein exposing the back side of the lithography mask to the VUV energy comprises exposing the lithography mask to light at a wavelength of about 160 to about 180 nm.

11. A method of repairing a lithography mask, the method comprising:

providing the lithography mask including a front side and a back side opposite the front side, the front side of the lithography mask being a patterned side of the lithography mask, the front side of the lithography mask being coupled to a pellicle, the lithography mask comprising:

a substrate;

a first patterned layer over the substrate, the first patterned layer comprising MoSi, the first patterned layer comprising a first set and a second set, the first set having an entirely exposed surface opposite of the substrate; and a second patterned layer over the second set of the first patterned layer, the second patterned layer comprising Cr, a continuous portion of the second patterned layer being directly interposed between a frame of the pellicle and the second set of the first patterned layer, at least a portion of the second set of the first patterned layer being directly interposed between the continuous portion of the second patterned layer and the substrate;

exposing the back side of the lithography mask to a vacuum ultraviolet (VUV) energy, the back side of the lithography mask being interposed between a VUV energy source and the front side of the lithography mask during the exposing, the VUV energy impinging a back side surface of the second patterned layer such that the second patterned layer blocks an adhesive layer from the VUV energy, the adhesive layer being directly interposed between the second patterned layer and the frame of the pellicle; and cleaning the lithography mask.

12. The method according to claim 11, wherein exposing the back side of the lithography mask to the VUV energy comprises exposing the lithography mask to light at a wavelength of about 160 to about 180 nm.

13. The method according to claim 11, wherein exposing the back side of the lithography mask to the VUV energy comprises exposing the lithography mask for about 3 minutes to about 10 minutes.

14. The method according to claim 11, wherein exposing the lithography mask to the VUV energy comprises exposing the substrate of the lithography mask.

15. The method according to claim 11, wherein the substrate of the lithography mask comprises a quartz substrate, wherein the first patterned layer comprises MoSi, and wherein the second patterned layer comprises Cr.

16. The method according to claim 11, wherein the method comprises removing the pellicle from the lithography mask after exposing the back side of the lithography mask to the VUV energy, and then cleaning the lithography mask.

17. The method according to claim 16, wherein the lithography mask is coupled to the pellicle by an adhesive, further comprising removing the adhesive from the lithography mask after removing the lithography mask from the pellicle, and then cleaning the lithography mask.

18. The method according to claim 11, wherein the lithography mask has haze disposed thereon, and wherein cleaning the lithography mask comprises removing substantially all of the haze from the lithography mask.

19. The method according to claim 18, wherein a surface of the lithography mask is hydrophobic before exposing the lithography mask to the VUV energy.

20. The method according to claim 19, wherein exposing the back side of the lithography mask to the VUV energy causes the surface of the lithography mask to become hydrophilic.

* * * * *